United States Patent
Morrison et al.

(10) Patent No.: US 6,787,818 B2
(45) Date of Patent: Sep. 7, 2004

(54) DIFFUSED JUNCTION PHOTODETECTOR AND FABRICATION TECHNIQUE

(75) Inventors: Charles B. Morrison, La Crescenta, CA (US); Rengarajan Sudharsanan, Stevenson Ranch, CA (US); Moran Haddad, Winnetka, CA (US); Dimitri Krut, Encino, CA (US); Joseph C. Boisvert, Thousand Oaks, CA (US); Richard R. King, Thousand Oaks, CA (US); Nasser H. Karam, Northridge, CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 10/172,310

(22) Filed: Jun. 14, 2002

(65) Prior Publication Data

US 2003/0230761 A1 Dec. 18, 2003

Related U.S. Application Data

(63) Continuation-in-part of application No. 09/976,508, filed on Oct. 12, 2001.

(51) Int. Cl.[7] ............... H01L 31/0328; H01L 31/0336; H01L 31/072; H01L 31/109
(52) U.S. Cl. .................................. 257/184; 257/439
(58) Field of Search ................................ 257/184, 439

(56) References Cited

U.S. PATENT DOCUMENTS

| | | | |
|---|---|---|---|
| 3,874,952 A | * 4/1975 | Woodall | ...... 117/54 |
| 4,534,099 A | 8/1985 | Howe | |
| 4,669,882 A | 6/1987 | Goss et al. | |
| 4,862,236 A | 8/1989 | Shin et al. | |
| 5,053,837 A | * 10/1991 | Tonai | ...... 257/458 |
| 5,944,913 A | * 8/1999 | Hou et al. | ...... 136/255 |
| 6,005,278 A | * 12/1999 | Fukunaga et al. | ...... 257/446 |
| 6,380,601 B1 | 4/2002 | Ermer et al. | |
| 2003/0070707 A1 | * 4/2003 | King et al. | ...... 136/255 |

* cited by examiner

Primary Examiner—David Nelms
Assistant Examiner—Tu-Tu Ho
(74) Attorney, Agent, or Firm—Terje Gudmestad

(57) ABSTRACT

A diffused junction semiconductor (12) for detecting light (48) at a predetermined wavelength is provided including a base (30) and an epitaxial structure (32) electrically coupled to the base (30). The epitaxial structure (32) forms a p-n junction (38) in the base (30). The epitaxial structure (32) includes at least one diffusion layer (50) electrically coupled to the base (30). At least one of the diffusion layers (50) contributes impurities in at least a portion of the base (30) to form the p-n junction (38) during growth of the epitaxial structure (32). A method for performing the same is also provided.

11 Claims, 5 Drawing Sheets

DIFFUSED JUNCTION PHOTODETECTOR AND FABRICATION TECHNIQUE

RELATED APPLICATION

The present application is a continuation-in-part (CIP) application of published U.S. patent application Ser. No. 09/976,508 filed Oct. 12, 2001, entitled "WIDE-BANDGAP, LATICE-MISMATCHED WINDOW LAYER FOR A SOLAR ENERGY CONVERSION DEVICE", Pub. No. US 2003/0070707 A1, which is incorporated by reference herein.

TECHNICAL FIELD

The present invention relates generally to telecommunication transceivers, and more particularly, to a diffused junction photodetector for use in a transceiver and a method of fabricating the same.

BACKGROUND OF THE INVENTION

Telecommunication transceivers are utilized in various applications to transmit and receive communication signals in telecommunication networks. Fiberoptics are used as a transmission medium between the telecommunication transceivers for various transmission reasons including low noise interference, high-speed data transmission rates, and large multiplexing capabilities. In order for the telecommunication transceivers to receive the communication signals transmitted via light over fiberoptic cable, photodetectors are utilized.

Photodetectors transform light energy into electrical energy. Reverse saturation current is controlled by light intensity that shines on the photodetectors. The light generates electron-hole pairs, which induce current. The resulting current is directly proportional to the light intensity.

The use of fiberoptics introduces practical, feasible, and functional requirements. The photodetectors are preferably semiconductor diodes that are inexpensive due to large quantity requirements, reliable, and capable of responding to light signals having wavelengths between 1300 nm and 1600 nm. It is also desirable for the photodetectors to provide low noise or low dark current and be amendable to high volume production.

Commonly used photodetectors are industrially produced and include a germanium (Ge) base or Ge substrate. After formation of the Ge substrate, two general processes are used to form a p-n junction. The first process includes implanting phosphorus or arsenic impurities into the Ge substrate and the second process includes growing epitaxial crystal on the Ge substrate or by implanting phosphorus or arsenic impurities into the Ge substrate as to create a p-n junction. The above-mentioned processes, as known in the art, are expensive, time consuming, complex, and have a high defect rate. The Ge substrate post formation doping of impurities to form a p-n junction is highly susceptible to forming defects due to inherent nature of the post formation process.

It would therefore be desirable to develop a photodetector that provides low noise and is capable of responding to wavelengths between 1300 nm and 1600 nm. It would also be desirable to develop a process for fabricating the desired photodetector that is inexpensive, less time consuming to produce, less complex, and has a low defect rate.

SUMMARY OF THE INVENTION

The present invention provides a method and apparatus for a diffused junction photodetector for use in a transceiver and a method of fabricating the same. A diffused junction semiconductor for detecting light at a predetermined wavelength is provided including a base and an epitaxial structure electrically coupled to the base. The epitaxial structure forms a p-n junction in the base. The epitaxial structure includes at least one diffusion layer electrically coupled to the base. At least one of the diffusion layers contributes impurities in at least a portion of the base to form the p-n junction during growth of the epitaxial structure. A method for performing the same is also provided.

One of several advantages of the present invention is the ability to diffuse impurities into the base during growth of the epitaxial structure. In so doing, a p-n junction may be formed within a semiconductor using a relatively inexpensive technique and in a relatively short period of time as compared with traditional techniques. The inexpensive technique includes use of large area substrates in conjunction with a multi-layer wafer production metal organic vapor phase epitaxy (MOVPE) reactor.

Another advantage of the present invention is the ability to provide a semiconductor with low leakage current due to passivation of a wide bandgap semiconductor around the p-n junction, application of an anti-reflective coating over the epitaxial structure, and carrier concentration in the base.

Furthermore, the present invention provides application versatility in that resistivity of various layers of the substrate may be modified, thereby, adjusting various semiconductor parameters.

Other advantages and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
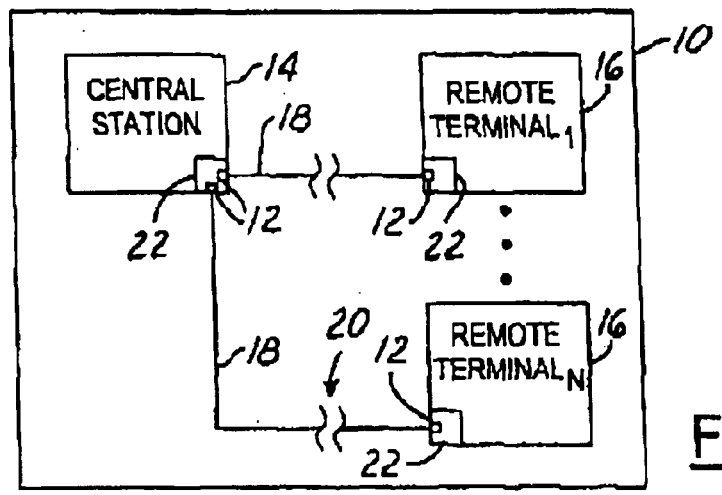
FIG. 1 is a block diagrammatic view of a telecommunication network utilizing diffused junction photodetectors formed in accordance with an embodiment of the present invention.

In each of the following figures, the same reference numerals are used to refer to the same components. While the present invention is described with respect to a method and apparatus for a diffused junction photodetector for use in a transceiver and a method of fabricating the same, the present invention may be adapted to be used in various systems and applications including: vehicle systems, control systems, communication systems, semiconductor lasers, photodetectors, photodiodes, fiber optic receiver detectors, solar cells, or other systems or applications that may utilize a diffused junction semiconductor.

In the following description, various operating parameters and components are described for one constructed embodiment. These specific parameters and components are included as examples and are not meant to be limiting.

Also, in the following description the term "semiconductor" may refer to any solid state device such as photodetectors, photodiodes, solar cells, or other solid state device known in the art.

Additionally, the present invention is applicable for low capacitance devices as well as low leakage current devices. In general, low capacitance devices are high-speed devices used in data detection. Low leakage current devices are not high-speed but are low power devices with high capacitance, which may be used, for example, as monitors to detect and correct laser power levels.

Referring now to FIG. 1, a block diagrammatic view of a telecommunication network 10 utilizing diffused junction photodetectors 12 formed in accordance with an embodiment of the present invention, is shown. The network 10 includes a central station 14 in communication with multiple remote terminals 16 via fiber optic cable 18. The remote terminals 16 may be a large distance from the central station 14, represented by breaks 20. The central station 14 and the remote terminals 16 have transceivers 22 containing photodetectors 12 that are fabricated in accordance with methods described in detail below.

Figure 2:
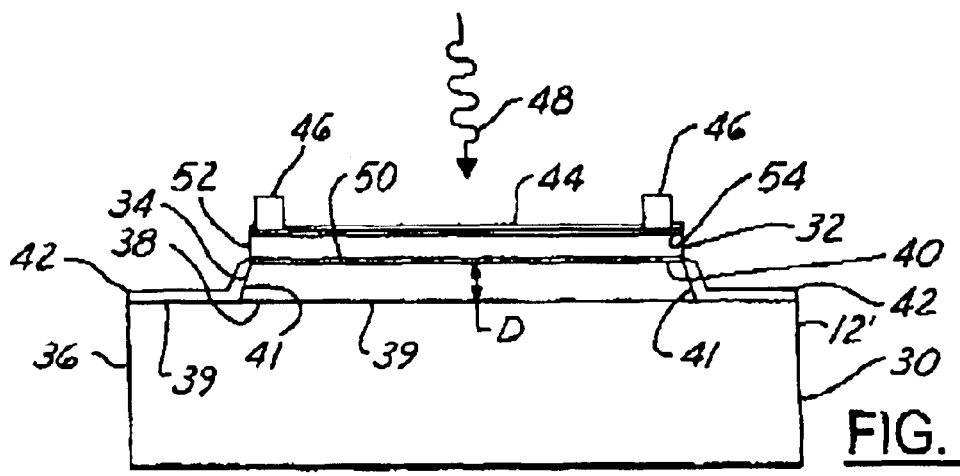
FIG. 2 is a cross-sectional view of a mesa diffused junction photodetector formed in accordance with an embodiment of the present invention.

Referring now to FIG. 2 is a cross-sectional view of a mesa diffused junction photodetector 12' formed in accordance with an embodiment of the present invention, is shown. The photodetector 12' includes a base 30 electrically coupled to an epitaxial structure 32. The base 30 includes a base layer 36 and an emitter layer 34, in combination forming a p-n junction 38. The base layer 36 has a base layer top surface 39. The emitter layer 34 has an emitter layer top surface 40 upon which the epitaxial structure 32 is grown, and side walls 41. A passivation dielectric layer 42 is coupled to the base 30 and prevents carrier recombination of at least a portion of the base 30. The epitaxial structure 32 is coated with an anti-reflective layer 44 and is electrically coupled to one or more contacts 46. As light 48 is received at various wavelengths through the anti-reflective layer 44 to the p-n junction 38 electrical energy is produced at the contacts 46.

Although, in a preferred embodiment of the present invention the base 30 is formed from germanium (Ge), other similar materials known in the art may be used. The emitter layer 34 is at least partially formed during growth of the epitaxial structure 32. The emitter layer 34 contains impurities such as phosphorus (P) and arsenic (As) as well as other impurities known in the art.

The epitaxial structure 32 includes a first diffusion layer or nucleation layer 50, a second diffusion layer or spacer layer 52, and a third diffusion layer or contact layer 54. The nucleation layer 50, the spacer layer 52, and the contact layer 54 contribute impurities that are diffused into the base 30 to form the n-type emitter layer 34 having a p-n junction depth D. FIG. 2 does not show the junction depth correctly. Please refer to the initial disclosure figure. The nucleation layer 50 may be formed of indium gallium phosphide (InGaP), indium aluminum phosphide (InAlP), GaAllnP, or other nucleation layer materials known in the art. The nucleation layer 50 couples the emitter layer 34 to the spacer layer 52. The spacer layer 52 may contain one or more layers and may be formed from gallium arsenic (GaAs) or other similar material known in the art. The base 30 when formed of Ga and the spacer layer 52 when formed of GaAs have mismatching lattice structures, which are difficult to couple together directly, the nucleation layer 50 serves as a coupler between these two layers. The spacer layer 52 has optical properties that allow photons to penetrate to the p-n junction 38. The contact layer 54 may also be formed from GaAs or other similar material known in the art. The contact layer 54 provides electrical contact between the contacts 46 and the p-n junction 38.

Figure 3:
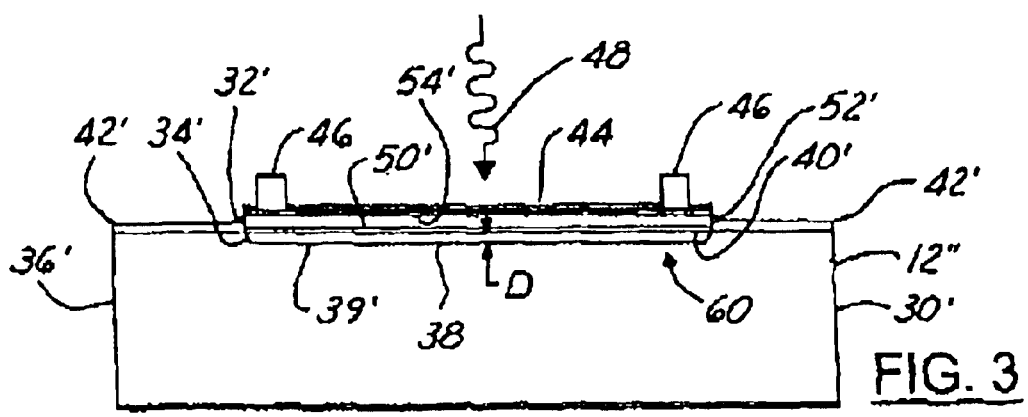
FIG. 3 is a cross-sectional view of a planar diffused junction photodetector formed in accordance with an embodiment of the present invention.

Referring now to FIG. 3 a cross-sectional view of a planar diffused junction photodetector 12" formed in accordance with an embodiment of the present invention is shown. The photodetector 12" is similar to the photodetector 12' of FIG. 2, except that instead of the emitter layer 34 protruding outward from the base layer 36 an emitter layer 34' is recessed within window 60 in a base layer 36' where an emitter layer top surface 40' is approximately flush with a base layer top surface 39'. Also, a passivation dielectric layer 42' is coupled to the base layer 36' and the epitaxial structure 32'.

Figure 4:
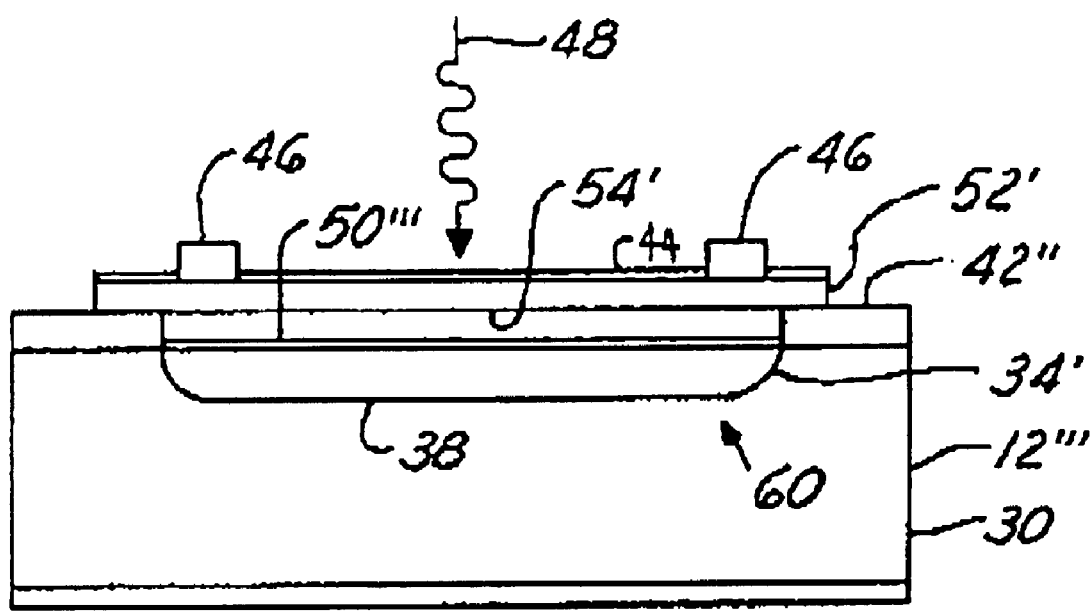
FIG. 4 is a cross-sectional view of a planar diffused junction photodetector formed in accordance with an embodiment of the present invention.

Referring now to FIG. 4 a cross-sectional view of a planar diffused junction photodetector 12'" formed in accordance with an embodiment of the present invention is shown. The photodetector 12'" is similar to the photodetector 12" of FIG. 3, except that a passivation dielectric layer 42" is a continuous layer over the contact layer 54' and the base 30.

Figure 5:
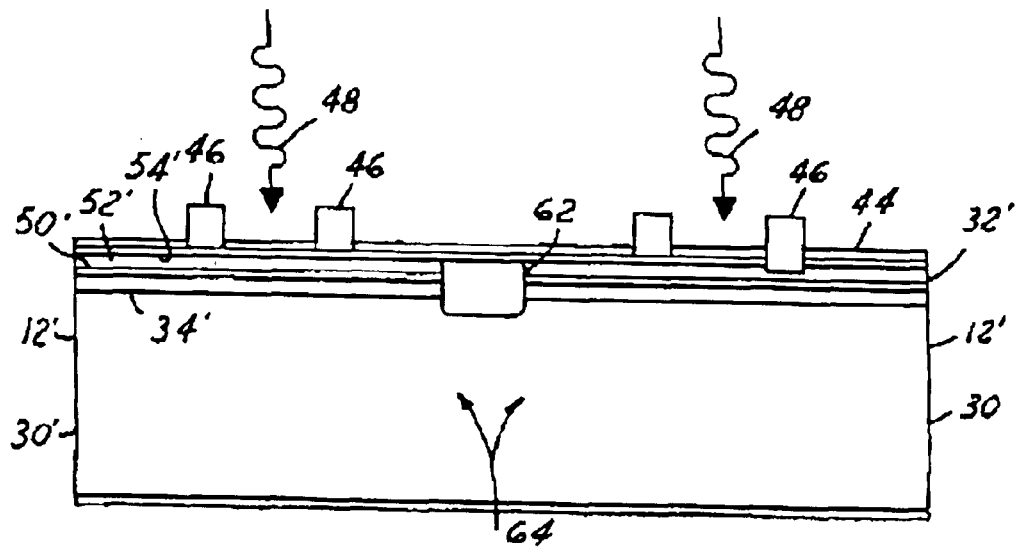
FIG. 5 is a cross-sectional view of more than one planar diffused junction photodetector including a channel stop and formed in accordance with an embodiment of the present invention.

Referring now to FIG. 5 a cross-sectional view of more than one planar diffused junction photodetectors 12', are shown, including a channel stop 62 between each photodetector 12'. The channel stop 62 may be used to separate photodetectors 12' and prevent reverse bias breakdown at edges 64 of each photodetector 12'. In a preferred embodiment of the present invention the channel stop 62 is formed of heavily doped p-type material of approximately $5 \times 10^{18}$ parts per cubic centimeter.

Figure 6:
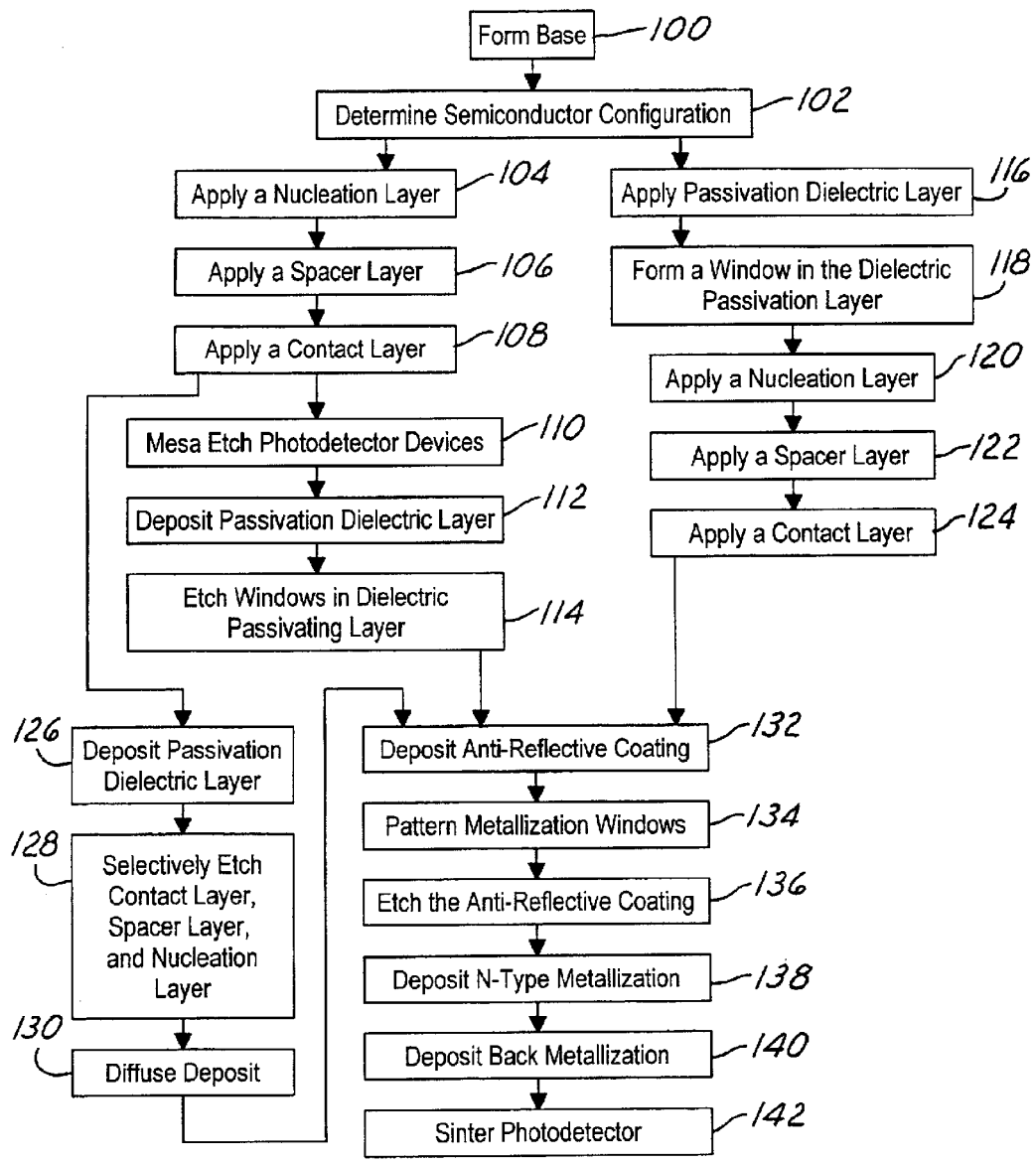
FIG. 6 is a logic flow diagram illustrating a method of fabricating a diffused junction semiconductor in accordance with an embodiment of the present invention.

Referring now to FIG. 6, a logic flow diagram illustrating a method of fabricating a diffused junction semiconductor, such as photodetectors 12 and 12' in accordance with an embodiment of the present invention, is shown.

In step 100, the bases (substrate) 30 and 30' are formed. The substrates 30 and 30' are selected having a particular p-type doping level. Various p-type doping level substrates may be selected. The p-type doping level is selected by determining a desired resistivity level of the substrates 30 and 30'. In so doing, the p-n junction depths 38 may be altered, and subsequently other semi-conductor properties may also be altered by adjusting resistivity level of the substrates 30 and 30', as shown below. A relationship between initial p-type doping level of the bases 30 and 30' and the p-n junction depths 38 are best illustrated by FIG. 6.

Figure 7:
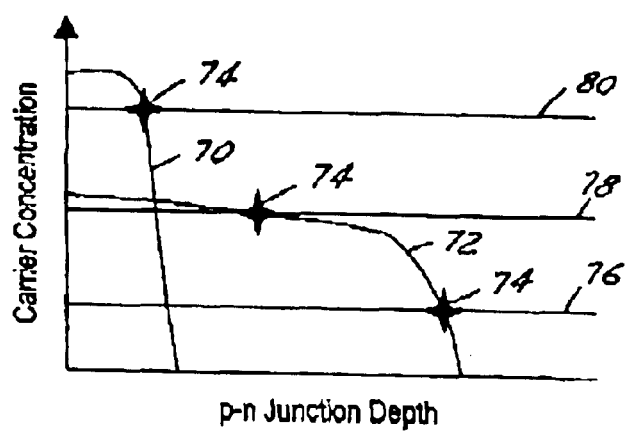
FIG. 7 is a plot of carrier concentration versus emitter layer depth for a diffused junction photodetector formed in accordance with an embodiment of the present invention.

Referring now also to FIG. 7 a plot of carrier concentration versus p-n junction depth D for diffused junction photodetectors 12 and 12' formed in accordance with embodiments of the present invention, is shown. A P-diffusion profile curve 70 and an As-diffusion profile curve 72 are shown with intersections 74 at three different doping levels, low 76, moderate 78, and heavy 80. As the initial doping level of the bases 30 and 30' are increased the depths 38 of the emitter layers 34 and 34' decreases.

In general, low resistivity substrates produce high shunt resistance photodetectors. On the other hand, high resistivity substrates produce low capacitance devices due to the p-n junction depth being larger because of low doping concentration of the substrate and the emitter layer width being broader. As known in the art, since capacitance is inversely proportional to the emitter layer depth and emitter layer width, capacitance values of photodetectors that are constructed from high resistivity substrates are lower than capacitance values of photodetectors constructed from low resistivity substrates.

Additionally, leakage current can be reduced by reducing the size of the p-n junction depths 38. Application of a bias voltage to a p-n junction results in a depletion region. A depletion region is a region that is depleted of carriers from intentional dopants. The reduction of the p-n junction depths 38 for low leakage current applications results in a shallow, more abrupt, junction, which minimizes potential for a depletion region. For low capacitance semiconductor devices a deep junction is preferred, therefore, high resistivity, low doped substrates are used.

In step 102, a determination is made as to whether the semiconductor is a mesa configuration or a planar configuration. When the semiconductor being fabricated is to have a mesa configuration upon forming the base steps 104–114 are performed, otherwise for planar configurations steps 116–124 are performed for one configuration and steps 104–108 and steps 126–130 are performed for another configuration.

Referring now to FIGS. 2 and 6, in steps 104–114, a p-n junction 38 is generated for the mesa configuration.

In step 104, the nucleation layer 50 is applied to the top surface 40 to grow the epitaxial structure 32 on the base layer 36. The nucleation layer 50 in a preferred embodiment of the present invention diffuses P atoms into the base 30 to form the emitter layer 34 as the epitaxial structure 32 is grown.

In step 106, the spacer layer 52, which is low-doped and of n-type material, is applied to the nucleation layer 50. As stated above the spacer layer 52 may include multiple layers. The spacer layer 52 in a preferred embodiment of the present invention diffuses As atoms into the base 30 to form the emitter layer 34 as the epitaxial structure 32 is grown.

In step 108, the contact layer 54, which is highly doped and also of n-type material, is applied to the spacer layer 52. The contact layer 54 may also contribute impurities into the base 30 to form the emitter layer 34.

In one preferred embodiment of the present invention the nucleation layer 50 is approximately 100 Å thick, the space layer 52 is approximately 0.5 $\mu$m thick, and the contact layer 54 is approximately 2000 Å thick. In another preferred embodiment of the present invention the nucleation layer 50 is between 0.9 E17 $cm^3$ and 3.0 E18 $cm^3$ doped or slightly doped, the spacer layer 52 is between 2.0 E17 $cm^3$ and 4.0 E17 $cm^3$ doped or moderately doped, and the contact layer 54 is between 7.0 E17 $cm^3$ and 9.0 E17 $cm^3$ doped or heavily doped.

In step 110, semiconductor devices are mesa-etched from the bases 30 and 30' and epitaxial structures 32 and 32'. The mesa-etching is performed preferably using a wet-etching technique that is known in the art.

In step 112, a dielectric passivating material, such as silicon dioxide, is deposited on the bases 30 and the side walls 41 preferably using a low temperature chemical vapor deposition process to form the dielectric passivating layer 42. The dielectric passivating layer 42 prevents carrier recombination of the base layer 36 and the emitter layer 34.

In step 114, windows are etched through the dielectric passivating material. The mesa passivation dielectric thickness is different than the AR coating thickness, so for simplicity the passivating dielectric is removed from an optical area of the semiconductor and a fresh AR coating is applied having an accurately controlled thickness.

Referring now to FIGS. 3 and 6, in steps 116–124, a p-n junction 38 is generated for a planar configuration. In step 116, the passivation dielectric layer 42 is applied to the top surfaces 39 and 40. The passivation dielectric layer 42 may be applied using a low temperature chemical vapor deposition process. The passivation dielectric layer 42 aids in preventing leakage current.

In step 118, a mask, preferably formed of silicon nitrate $Si_3N_4$, is applied to the top surface 39' to form the window 60 in the passivation dielectric layer 42'. Within the window 60 on the top surface 39' the epitaxial structure 32' is formed in steps 120–124.

In step 120, the nucleation layer 50' is applied to the top surface 39' to grow an epitaxial structure 32' on the base layer 36', similar to step 104 above.

In step 122, the spacer layer 52', which is low-doped and of n-type material, is applied to the nucleation layer 50', similar to step 106 above.

In step 124, the contact layer 54', which is highly doped and also of n-type material, is applied to the spacer layer 52', similar to step 108 above. Upon completion of step 124 step 132 is performed.

Referring now to FIGS. 4 and 6, in step 126 the passivation dielectric layer 42" is deposited over the contact layer 54' and the base 30.

In step 128, the contact layer 54', the spacer layer 52', and the nucleation layer 50" are selectively etched. An area of the passivation dielectric layer 42" is masked off, and etching extends below the p-n junction 38 to the base 30, to form the window 60.

In step 130, dopants are diffused, in the form of a heat treatment to drive the P-N junction 38 into the base 30. Although, by performing steps 104–108 and steps 126–130 over performing steps 116–124 no epitaxial regrowth is performed, there is more processing involved.

In step 132, the anti-reflective coating 44 is deposited on the epitaxial structures 32 and 32' using preferably a plasma-enhanced chemical vapor deposition process. The anti-reflective coating 44 also aids in preventing leakage current. The anti-reflective coating 44 allows most wavelengths of light to pass through to the p-n junction 38, especially desired wavelengths of interest.

In step 134, metallization windows are patterned on the anti-reflective coating 44 to minimize the amount of reflective light.

In step 136, anti-reflective coating 44 is etched down to the contact layer 54 to allow the metal contacts to abut the semiconductor surface. The anti-reflective coating is a high resistance insulator, thus is etched to allow current to flow in the semiconductor.

In step 138, n-type metallization of atoms, such as gold germanium (AuGe), nickel (Ni), and Au, are preferably deposited on exposed GaAs atoms of the contact layers 54 and 54' using electron beam evaporation.

In step 140, back metallization with atoms such as, titanium (Ti) and gold (Au), are similarly deposited on the contact layers 54 and 54'. The back metallization is preferably 150 Å of Ti and 3000 of Au Å in thickness.

In step 142, the photodetector is then sintered at approximately 450° C. for approximately 5 minutes.

The above-described steps are meant to be an illustrative example, the steps may be performed synchronously or in a different order depending upon the application. The steps may be applied for various semiconductors and with various materials depending upon the application.

Figure 8:
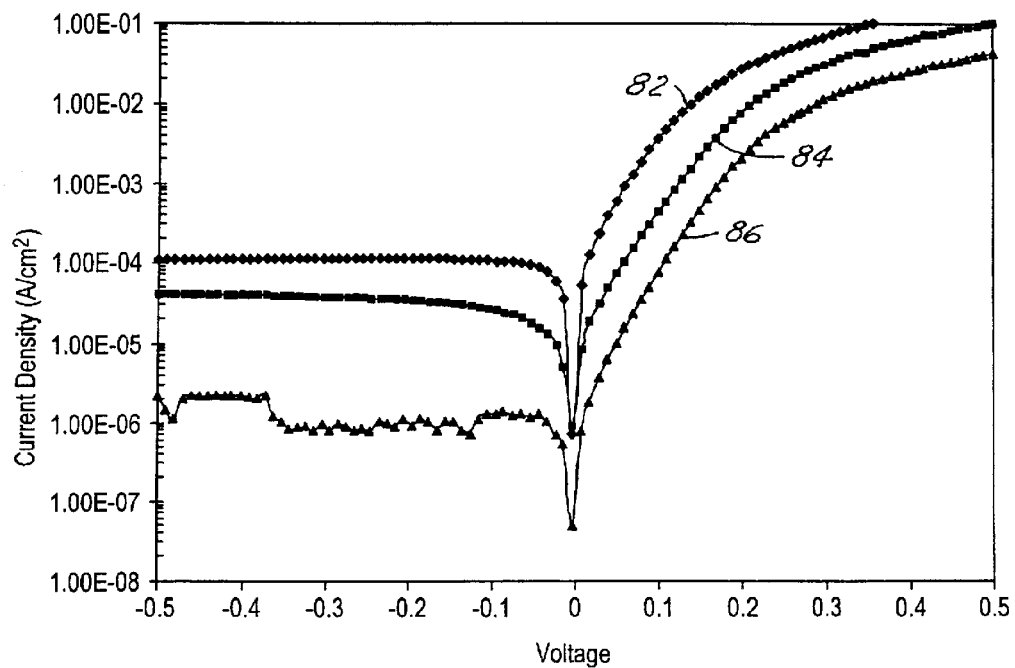
FIG. 8 is a plot of current density versus voltage for a diffused junction photodetector formed in accordance with an embodiment of the present invention.
Figure 9:
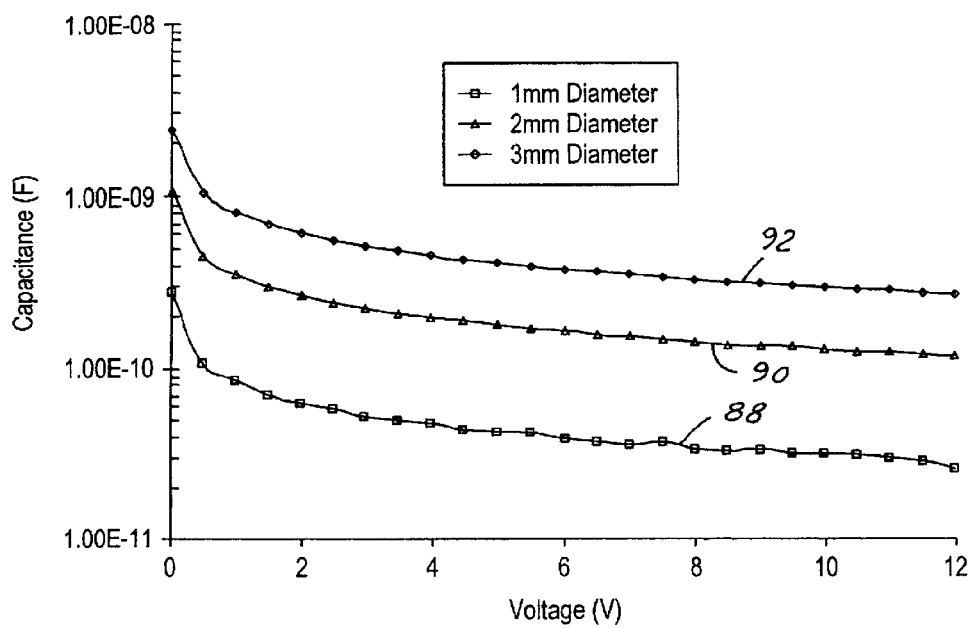
FIG. 9 is a plot of capacitance versus voltage for a diffused junction photodetector formed in accordance with an embodiment of the present invention.

By growing and processing identical photodetectors having substrates of varying resistivities, differences in characteristics of each photodetector are noted in Table 1 and FIGS. 8–9.

Referring now to Table 1, p-n junction depth and reverse breakdown voltage parameters are shown as a function of Ge substrate doping. As impurity concentration increase the p-n junction depth and the magnitude of the reverse breakdown voltage decreases.

TABLE 1

Junction Depth and Reverse Breakdown Voltage as a Function of Substrate Doping

| Substrate Doping Concentration (cm$^3$) | p-n Junction Depth - Normalized | Reverse Breakdown Voltage (V) |
|---|---|---|
| 5.00E+15 | 1 | −40 |
| 1.00E+17 | .32 | −4 |
| 8.50E+17 | .2 | −2 |
| 4.00E+18 | .12 | −1 |

Referring now to FIG. 8 a plot of current density versus voltage for a diffused junction photodetector, as a function of substrate doping, formed in accordance with an embodiment of the present invention is shown. Curve 82 represents a sample photodetector having a 2.5 E15 doping concentration, 1.0 mm normalized p-n junction depth, and 1.7 Kohms p-n junction resistance. Curve 84 represents a sample photodetector having a 1.0E17 doping concentration, 0.32 mm normalized p-n junction depth, and 10 Kohms p-n junction resistance. Curves 86 represents a sample photodetector having a 1.0E18 doping concentration, 0.2 mm normalized p-n junction depth, and 150 Kohms p-n junction resistance. Dark current-voltage characteristics are illustrated corresponding to photodetector Ge substrate doping concentration, normalized p-n junction depth, and shunt resistance. The reverse leakage current is inversely related to the doping concentration.

Referring now to FIG. 9 a plot of capacitance versus voltage for a diffused junction photodetector formed in accordance with an embodiment of the present invention is shown. Low capacitance photodetector examples are illustrated having Ge substrates of approximately 3 ohm-cm resistivity. Three curves 88, 90, and 92 are shown for three photodetectors having 1 mm, 2 mm, and 3 mm diameters, respectively. The three photodetector examples illustrate roll-off capacitance with increasing voltage.

The present invention provides a photodetector that has low leakage current, (or low capacitance), is less time consuming and relatively inexpensive to manufacture, and provides versatility in that it may be applied to many different applications. The present invention is also amendable to high volume production.

The above-described apparatus, to one skilled in the art, is capable of being adapted for various purposes and is not limited to the following systems: vehicle systems, control systems, communication systems, semiconductor lasers, photodetectors, photodiodes, fiber optic receiver detectors, solar cells, or other systems or applications that may utilize a diffused junction semiconductor. The above-described invention may also be varied without deviating from the spirit and scope of the invention as contemplated by the following claims.

What is claimed is:

1. A diffused junction semiconductor for detecting light at a predetermined wavelength comprising:

a base; and an epitaxial structure electrically coupled to said base and forming a p-n junction in said base comprising;

at least one diffusion layer electrically coupled to said base and at least one of said diffusion layers contributing impurities, which are non-extrinsic elements, in at least a portion of said base to form said p-n junction during growth of said epitaxial structure.

2. A semiconductor as in claim 1 wherein said at least one diffusion layer electrically couples an emitter layer of said base to at least one contact.

3. A semiconductor as in claim 1 wherein said at least one diffusion layer comprises a nucleation layer.

4. A semiconductor as in claim 1 wherein said at least one diffusion layer comprises a passivating layer.

5. A semiconductor as in claim 1 wherein said at least one diffusion layer comprises a contact layer.

6. A semiconductor as in claim 1 wherein at least a portion of said base comprises p-type material.

7. A semiconductor as in claim 1 wherein at least a portion of said base comprises n-type material comprising at least one of germanium, phosphorus, and arsenic.

8. A semiconductor as in claim 1 further comprising a passivation dielectric layer coupled to said base and preventing carrier recombination of at least a portion of said base.

9. A semiconductor as in claim 1 wherein said base comprises a recessed volume comprising an emitter layer.

10. A semiconductor as in claim 1 wherein the semiconductor forms a plurality of semiconductor devices and further comprises a channel stop electrically coupled to said base and said epitaxial structure, said channel stop preventing reverse bias breakdown between said plurality of semiconductor devices.

11. A semiconductor as in claim 1 wherein said impurities are constituent elements of said at least one diffusion layer.

* * * * *